(12) United States Patent
Chen (10) Patent No.: US 8,241,990 B2
(45) Date of Patent: Aug. 14, 2012

(54) AIR GAP FABRICATING METHOD

(75) Inventor: Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 154 days.

(21) Appl. No.: 12/649,333

(22) Filed: Dec. 30, 2009

(65) Prior Publication Data

US 2011/0156201 A1   Jun. 30, 2011

(30) Foreign Application Priority Data

Dec. 29, 2009   (TW) .............................. 98145665 A (51) Int. Cl.
*H01L 21/76*   (2006.01)

(52) U.S. Cl. .......... 438/421; 257/E21.573; 257/E21.581

(58) Field of Classification Search .................. 257/410, 257/522, E21.573, E21.581, E29.02, E23.013; 438/421

See application file for complete search history.

(56) References Cited

U.S. PATENT DOCUMENTS

| | | | |
|---|---|---|---|
| 6,287,979 B1 * | 9/2001 | Zhou et al. ..................... | 438/723 |
| 6,795,338 B2 | 9/2004 | Parkinson et al. | |
| 6,815,704 B1 | 11/2004 | Chen | |
| 6,936,840 B2 | 8/2005 | Sun et al. | |
| 7,113,055 B2 | 9/2006 | Nakatsuka et al. | |
| 7,259,038 B2 | 8/2007 | Scheuerlein | |
| 7,393,776 B2 | 7/2008 | Colburn et al. | |
| 2006/0249726 A1 | 11/2006 | Choi et al. | |
| 2007/0054493 A1 * | 3/2007 | Nam ............................ | 438/689 |
| 2007/0115794 A1 | 5/2007 | Lung | |
| 2007/0126040 A1 | 6/2007 | Lung | |
| 2007/0132049 A1 | 6/2007 | Stipe | |
| 2007/0158200 A1 | 7/2007 | Cohen et al. | |
| 2007/0160760 A1 | 7/2007 | Shin et al. | |
| 2007/0236988 A1 | 10/2007 | Chen | |
| 2007/0246699 A1 | 10/2007 | Lung | |
| 2007/0272950 A1 | 11/2007 | Kim et al. | |
| 2008/0029481 A1 | 2/2008 | Kothari et al. | |
| 2008/0073637 A1 | 3/2008 | Kuh et al. | |
| 2008/0096344 A1 | 4/2008 | Lai et al. | |
| 2008/0135758 A1 * | 6/2008 | Yang et al. ................. | 250/338.1 |
| 2008/0304308 A1 | 12/2008 | Stipe | |
| 2009/0148981 A1 | 6/2009 | Lai et al. | |

* cited by examiner

*Primary Examiner* — Matthew Landau
*Assistant Examiner* — Colleen E Snow
(74) *Attorney, Agent, or Firm* — Jianq Chyun IP Office (57) ABSTRACT

An air gap fabricating method is provided. A patterned sacrificial layer is formed over a substrate, and the material of the patterned sacrificial layer includes a germanium-antimony-tellurium alloy. A dielectric layer is formed on the patterned sacrificial layer. A reactant is provided to react with the patterned sacrificial layer and the patterned sacrificial layer is removed to form a structure with an air gap disposed at the original position of the patterned sacrificial layer.

26 Claims, 13 Drawing Sheets

AIR GAP FABRICATING METHOD

CROSS-REFERENCE TO RELATED APPLICATION

This application claims the priority benefit of Taiwan application serial no. 98145665, filed on Dec. 29, 2009. The entirety of the above-mentioned patent application is hereby incorporated by reference herein and made a part of this specification.

BACKGROUND OF THE INVENTION

1. Field of the Invention

The invention is related to an air gap fabricating method capable of fabricating a structure having an air gap for a semiconductor device.

2. Description of Related Art

Integrated circuit (IC) chips use air gaps within a dielectric material to increase the insulative characteristics of the dielectric material. Air gaps as dielectrics may also pose problems when used in conjunction with unlanded vias. An unlanded via is partially coupled to the dielectric between metal lines instead of to a metal portion of the metal line. During fabrication, the cavity in which an unlanded via is to be foamed may accidentally penetrate the dielectric portion and expose an air gap on a lower dielectric layer. The air gap may then be filled with metal during the via metallization step, causing a short in a circuit.

SUMMARY OF THE INVENTION

An air gap fabricating method is introduced herein, in which high selectivity between a patterned sacrificial layer and a reactant is utilized to fabricate a structure with an air gap.

In one of exemplary embodiments, an air gap fabricating method is described herein. The patterned sacrificial layer is formed over a substrate, wherein a material of the patterned sacrificial layer includes a germanium-antimony-tellurium alloy. A dielectric layer is formed on the patterned sacrificial layer. A reactant is provided to react with the patterned sacrificial layer and the patterned sacrificial layer is removed to form a structure with an air gap disposed at an original position of the patterned sacrificial layer.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In an air gap fabricating method of one of exemplary embodiments, a patterned sacrificial layer which has the material of the germanium-antimony-tellurium alloy is used in cooperation with the reactant (which is mainly gallic acid or the hydrogen-helium plasma), which is highly reactive towards the patterned sacrificial layer, so that the patterned sacrificial layer is almost completely removed and the air gap is fabricated. By using the resistive memory device and the fabricating method thereof which apply the air gap fabricating method, the resistive memory device with the air gap is fabricated. In particular, during the process of fabricating the resistive memory device, the patterned sacrificial layer having the constituent of the germanium-antimony-tellurium alloy further has effects of protecting the resistance switching material layer.

In one of exemplary embodiments, an air gap fabricating method is provided. First, at least one patterned sacrificial layer is formed over a substrate, and a material of the patterned sacrificial layer includes a germanium-antimony-tellurium alloy. Then, a dielectric layer is formed on the patterned sacrificial layer. A reactant is provided to react with the patterned sacrificial layer and the patterned sacrificial layer is removed to form a structure with an air gap disposed at an original position of the patterned sacrificial layer.

In one of exemplary embodiments, the reactant includes an organic acid which substantially includes gallic acid and a solvent.

In one of exemplary embodiments, the reactant includes a hydrogen-helium plasma. A weight percentage of hydrogen in the hydrogen-helium plasma is about 5%, and a weight percentage of helium in the hydrogen-helium plasma is about 95%. The hydrogen-helium plasma reacts with the sacrificial layer for 400 to 800 seconds. The weight percentage of hydrogen and the reaction time may be adjusted according to design requirements and are not limited to the above conditions.

In one of exemplary embodiments, after the step of removing the patterned sacrificial layer, a step of washing the dielectric layer with deionized water is further included. According to the present embodiment, after the step of washing the dielectric layer with deionized water, a solution which includes isopropyl alcohol (IPA) may be used to further dry clean the dielectric layer, so that water which causes pattern collapse is brought away by the IPA. According to an embodiment of the invention, a material of the dielectric layer includes silicon oxide, silicon nitride, or another dielectric material.

In one of exemplary embodiments, a multi-layered stack of a semiconductor layer and a metal layer may be formed on the dielectric layer. A material of the semiconductor layers includes polysilicon or amorphous silicon. A material of the metal layer includes aluminum, copper, tungsten, nickel, cobalt, titanium, a tungsten-titanium alloy, titanium nitride, tantalum nitride, titanium silicide, tantalum silicide, nickel silicide, or cobalt silicide.

In one of exemplary embodiments, a metal pattern is formed on the substrate, and a metal oxide layer is formed on the metal pattern. When the reactant is used to remove the patterned sacrificial layer, the reactant simultaneously removes the metal oxide layer.

In one of exemplary embodiments, an annealing temperature of the patterned sacrificial layer is from about 100° C. (degrees centigrade) to about 400° C.

In the following, different embodiments are described in associate with the figures.

Air Gap Fabricating Method

Figure 1A:
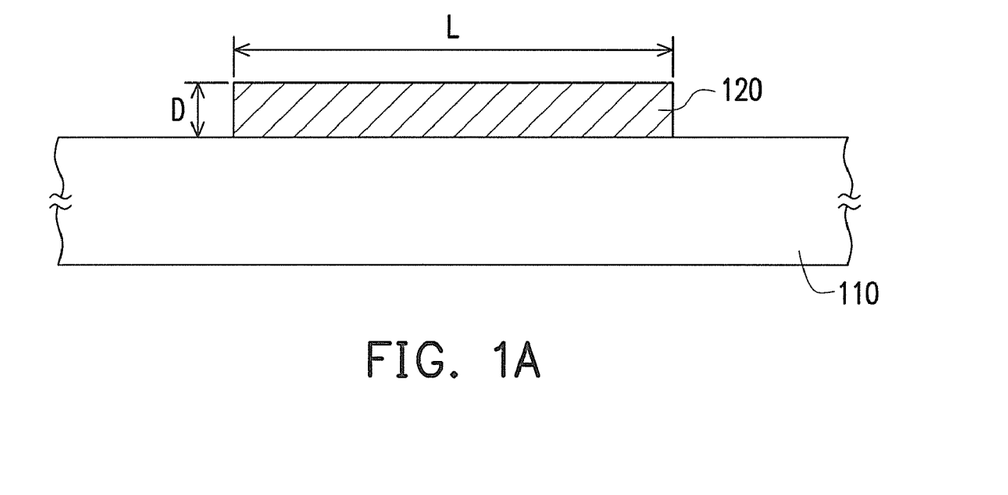
FIGS. 1A to 1E are schematic views showing a process of an air gap fabricating method according to one of exemplary embodiments.
Figure 1B:
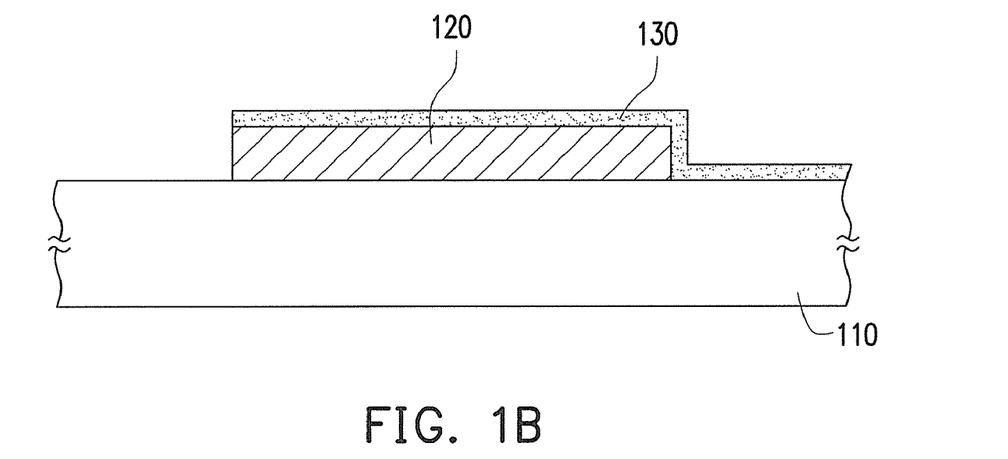
Figure 1C:
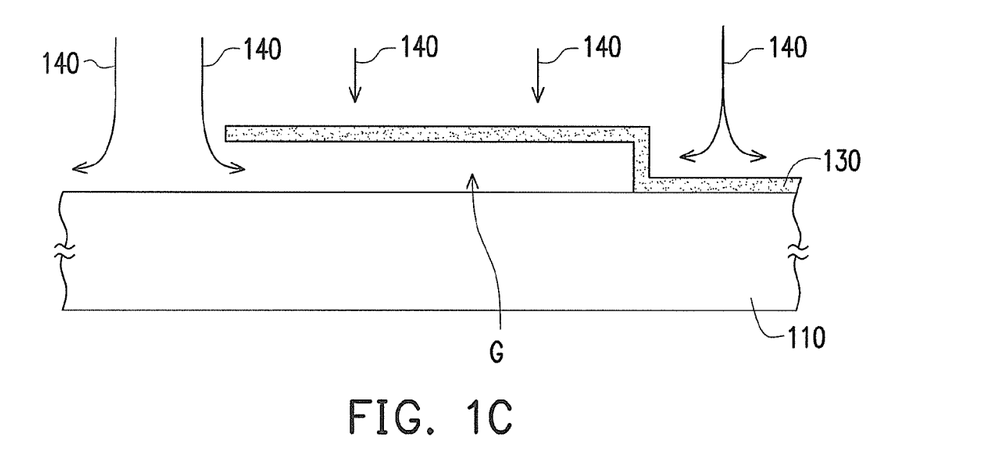

FIGS. 1A to 1C are schematic views showing a process of an air gap fabricating method according to an embodiment of the invention. Referring to FIG. 1, a patterned sacrificial layer 120 is first formed over a substrate 110, including physically on the substrate 110 or any intervening layer interposed therebetween. A material of the pattern sacrificial layer 120 includes a germanium-antimony-tellurium ($Ge_xSb_yTe_z$) alloy, which is a main constituent of the material. A composition ratio X:Y:Z of Ge:Sb:Te may be 2:2:5 or another suitable ratio. The germanium-antimony-tellurium alloy is a special phase change material. A phase change material thin film may be deposited by a physical vapor deposition method, a chemical vapor deposition method, or a suitable thin film deposition method. Next, a general photolithography and etching process is used in cooperation, so that the patterned sacrificial layer 120 in FIG. 1 is obtained.

Referring to FIG. 1B, a dielectric layer 130 is formed on the patterned sacrificial layer 120. A part of the dielectric layer 130 covers the patterned sacrificial layer 120 and the substrate 110 adjacent thereto, and the dielectric layer 130 exposes a part of the patterned sacrificial layer 120. The method of forming the dielectric layer 130 may be using a mask with a thin film deposition process, so that the dielectric layer 130 is partially formed on the patterned sacrificial layer 120. The material of the dielectric layer 130 is, for example, silicon oxide, silicon nitride, or another appropriate dielectric material. If the mechanical strength of the dielectric layer 130 is insufficient so that softening and collapse might occur, the multi-layered stack of a semiconductor layer (not shown) and a metal layer (not shown) may be formed on the dielectric layer 130. A material of the semiconductor layer includes polysilicon or amorphous silicon. A material of the metal layer includes aluminum, copper, tungsten, nickel, cobalt, titanium, a tungsten-titanium alloy, titanium nitride, tantalum nitride, titanium silicide, tantalum silicide, nickel silicide, or cobalt silicide. In detail, amorphous silicon, other metals, semiconductors, or multi-layered dielectric stacks with greater mechanical strength may be formed on or under the dielectric layer 130, or the dielectric layer may be omitted according to the field of application.

Afterwards, referring to FIG. 1C, a reactant 140 is provided to react with the patterned sacrificial layer 120, and the patterned sacrificial layer 120 is removed to form an air gap G disposed at an original position of the patterned sacrificial layer 120.

In one of exemplary embodiments, in the method of fabricating the air gap G, the germanium-antimony-tellurium alloy is used as a main material of the patterned sacrificial layer 120. In particular, the reactant is able to react with the germanium-antimony-tellurium alloy highly selectively, so that it is possible to almost completely remove the patterned sacrificial layer 120. For example, the reactant 140 may include the organic acid which substantially includes, for example, gallic acid and the solvent. The organic acid with gallic acid as a main constituent is able to react well with the germanium-antimony-tellurium alloy, so that the patterned sacrificial layer 130 is almost completely removed by a wet washing method.

Additionally, the reactant may be the hydrogen-helium plasma. Similarly, the hydrogen-helium plasma is able to react well with the germanium-antimony-tellurium alloy, so that the patterned sacrificial layer 120 is almost completely removed by a plasma washing method. Here a composition ratio of the hydrogen-helium plasma and a reaction time of the hydrogen-helium plasma with the patterned sacrificial layer 120 are not limited. For example, according to an embodiment, the weight percentage of hydrogen in the hydrogen-helium plasma is substantially about 5%, and the weight percentage of helium in the hydrogen-helium plasma is substantially about 95%. The hydrogen-helium plasma may react with the patterned sacrificial layer 120 for about 400 to 800 seconds, so as to almost completely remove the patterned sacrificial layer 120.

The above wording of "almost completely remove the patterned sacrificial layer 120" does not mean removing the patterned sacrificial layer 120 with absolutely no residue. By adopting the reactant 140 (the organic acid or the hydrogen-helium plasma) provided according to the present embodiment, a superb space is formed for the structure with the air gap, and almost no or little residue is present. The above may be viewed as the criteria of "almost completely removing" or as the design requirement.

Figure 1D:
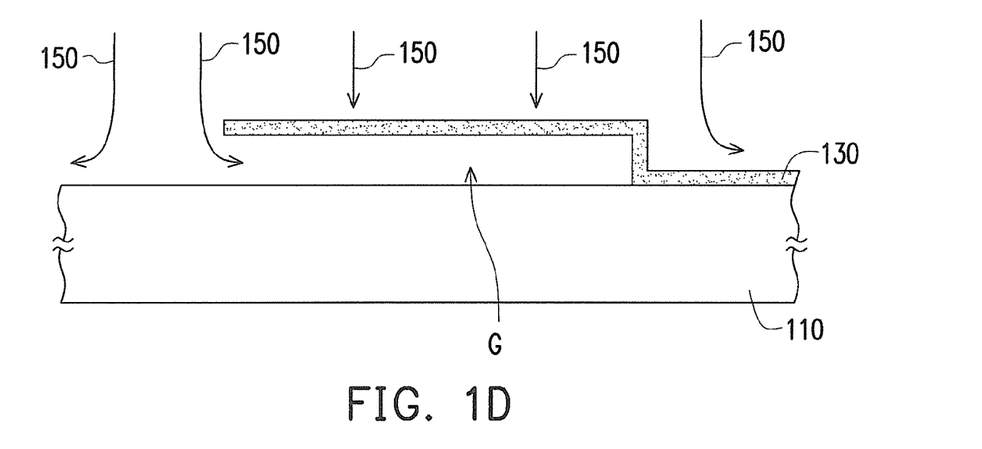

Referring to FIG. 1D, after the step of removing the patterned sacrificial layer 120 as shown in FIG. 1C, the dielectric layer 130 may be washed with deionized water 150. The residual reactant 140 is hence removed.

Figure 1E:
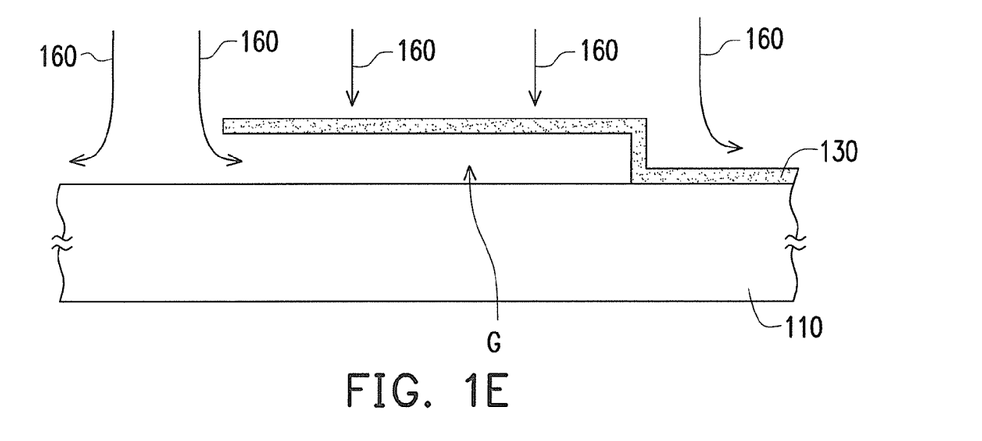

Referring to FIG. 1E, after the step of washing the dielectric layer 130 with the deionized water 150 as shown in FIG. 1D, IPA 160 may be used to dry clean the dielectric layer 130, so as to remove the residual water.

The embodiment in which the germanium-antimony-tellurium alloy reacts with gallic acid (or the hydrogen-helium plasma) to form the air gap G has a great range of applications. For example, it is capable of being used in fields such as micro electro-mechanical systems (MEMS), nano electro-mechanical systems (NEMS), copper wire processes, radio frequency devices, resistive memory deices, and dynamic random access memories.

For example, when the air gap fabricating method is applied in MEMS or NEMS, as shown in FIG. 1A, the patterned sacrificial layer 120 may be fabricated as a pattern which has a high length to width ratio (L/D). As shown in FIG. 1C, when the patterned sacrificial layer 120 is almost completely removed, the dielectric layer 130 becomes a cantilever beam structure. The air gap fabricating method provides a good solution for the obstacles in fabricating miniature cantilever beams in MEMS or NEMS.

In addition, the air gap fabricating method may be used to fabricate the air dielectric layer in copper wire processes. Compared with a conventional copper wire process in which silicon oxide is used as the dielectric layer, the copper wire processes which adopts the air dielectric layer has smaller parasitic capacitance. In addition, the air gap fabricating method may also be used to fabricate the air dielectric layer in the radio frequency devices. Compared with a conventional radio frequency device in which silicon oxide is used as the dielectric layer, the radio frequency device using the air gap as the dielectric layer can operate in a faster speed than before.

Figure 2A:
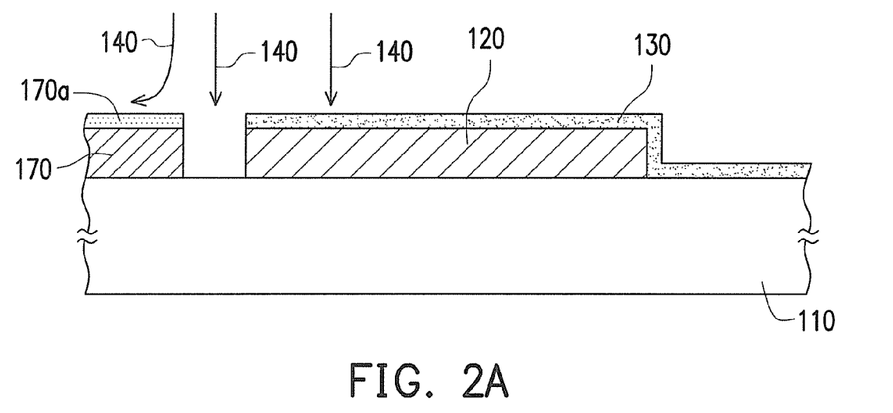
FIGS. 2A to 2B are schematic views showing a partial process of another air gap fabricating method according to another one of exemplary embodiments.
Figure 2B:
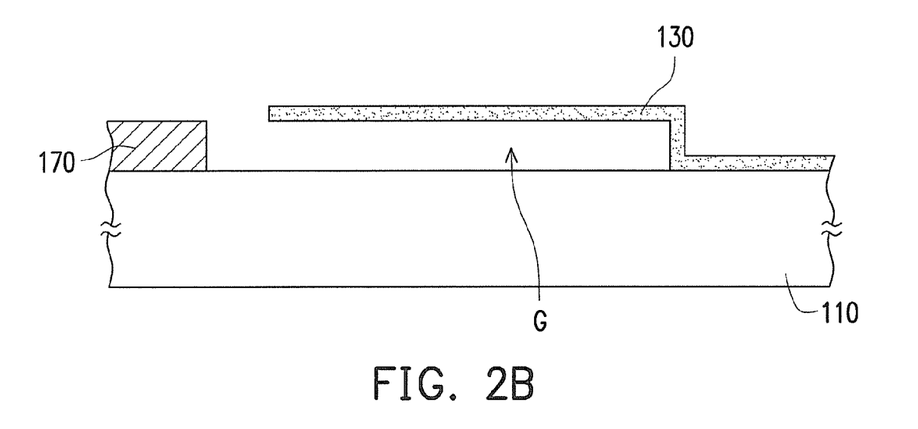

FIGS. 2A to 2B are schematic views showing a partial process of another air gap fabricating method according to an embodiment of the invention. Referring to both FIGS. 2A and 2B, a metal pattern 170 is formed on the substrate 110, and a metal oxide layer 170a is formed on the metal pattern 170. When the reactant 140 is used to remove the patterned sacrificial layer 120, the reactant 140 also removes the metal oxide layer 170a.

The reactant 140 (such as the hydrogen-helium plasma) is capable of removing the native oxide (which is the metal oxide layer 170a) of the metal pattern 170 by reduction (5% H2/He uses reduction reaction to eliminate metal native oxide, in which the reduced metal is still staying in its original position of metal oxide while the gallic acid is exactly stripping metal oxide away from metal surface). Furthermore, it can be known from the above description that the reactant 140 has high reactivity towards the gemianium-antimony-tellurium alloy. By utilizing such a characteristic, as in the embodiment shown in FIGS. 2A and 2B, the reactant 140 (gallic acid or the hydrogen-helium plasma) is capable of simultaneously removing the metal oxide layer 170a and the patterned sacrificial layer 120, but does not affect the dielectric layer 130 and the metal pattern 170.

The annealing temperature of the patterned sacrificial layer 120 shown in FIGS. 1A and 2A is from substantially about 100° C. to about 400° C. (the main constituent that is used is the gemianium-antimony-tellurium alloy). The depositing temperature of the patterned sacrificial layer 120 during the step of chemical vapor depositing the metal film (generally at a temperature of about 300° C. to 400° C.), the patterned sacrificial layer 120 is used in cooperation with the reactant 140 to fabricate the air gap G, and the flexibility of the process is thereby enhanced. Generally, by using a method in which the photoresist is used as the patterned sacrificial layer and along with a photoresist stripper or an oxygen plasma to fabricate the air gap G, the patterned sacrificial layer which has the photoresist as a constituent cannot sustain the high temperature of about 200° C. to 400° C.

The air gap fabricating method has a great range of applications. The following provides relevant disclosure on the resistive memory device, but the invention is not limited thereto.

Resistive Memory Device Fabricating Method

FIGS. 3A to 3J are schematic views showing a process of a resistive memory device fabricating method using a process of an air gap fabricating method according to one of the exemplary embodiments of the invention. In each of FIGS. 3A to 3J, the line I-I is drawn along the X direction, and the line II-II is drawn along the Y direction. Please refer to FIGS. 3A to 3J to comprehend the fabricating process of the resistive memory device.

Figure 3A:
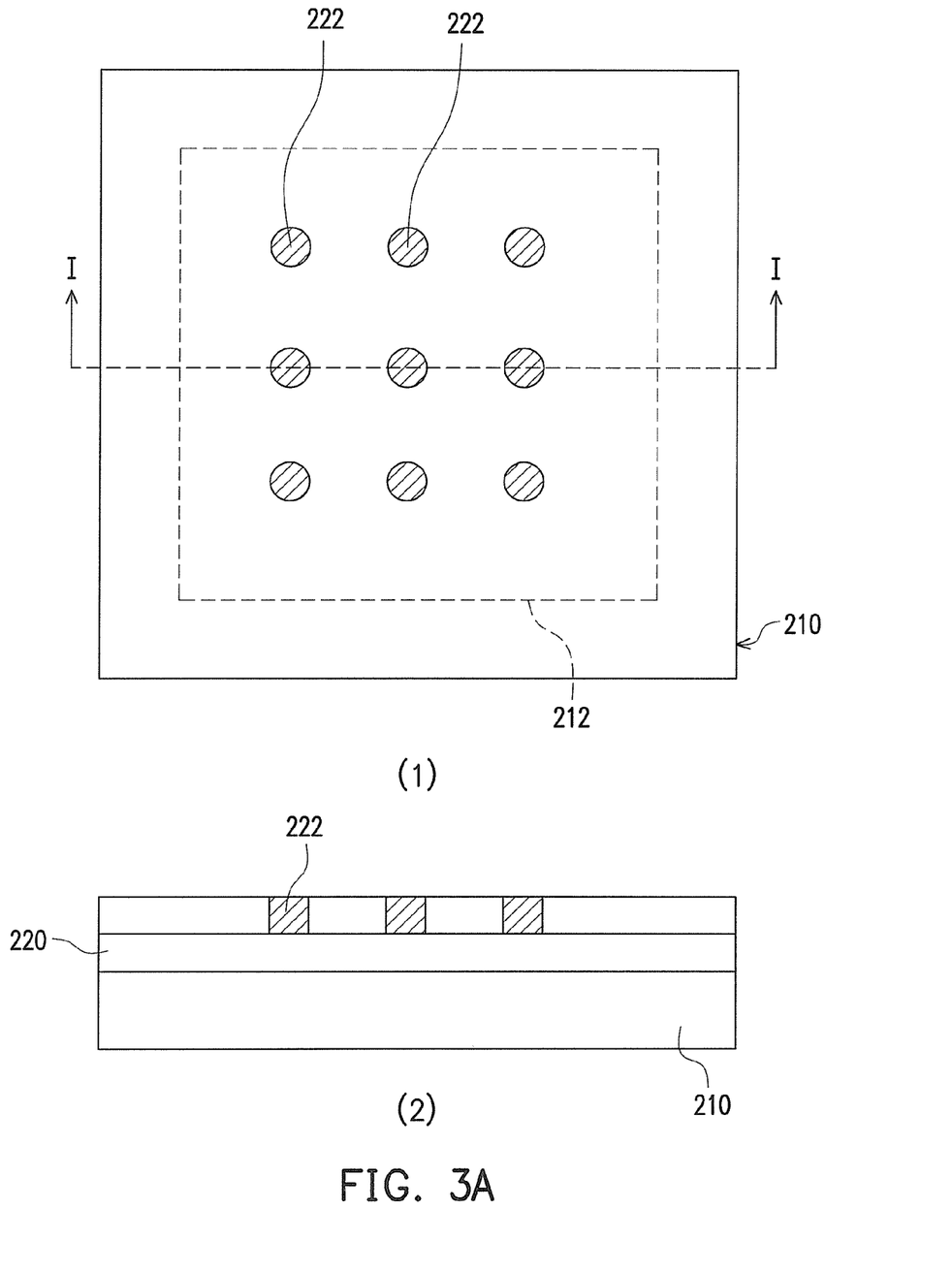
FIGS. 3A to 3J are schematic views showing a process of a resistive memory device fabricating method using a process of an air gap fabricating method according to one of exemplary embodiments.

Referring to FIG. 3A, part (1) is a top view of the device, and part (2) is a cross-sectional view along the line I-I in part (1). First, a substrate 210 which has an active region 212 is provided. A front end circuit 220 is formed in the active region 212, and the front end circuit 220 has a plurality of conductive channels 222 arranged as an array.

Figure 3B:
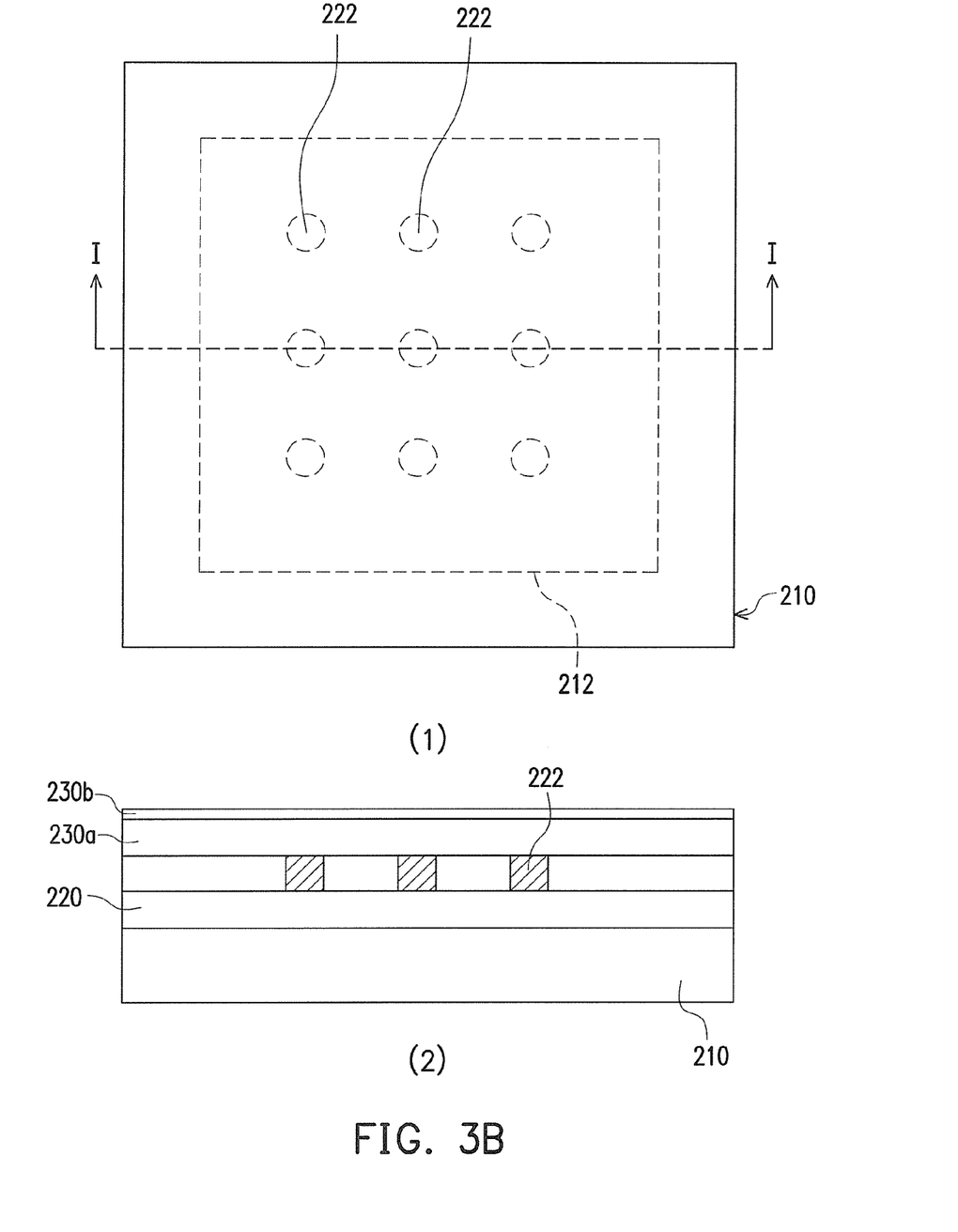
Figure 3C:
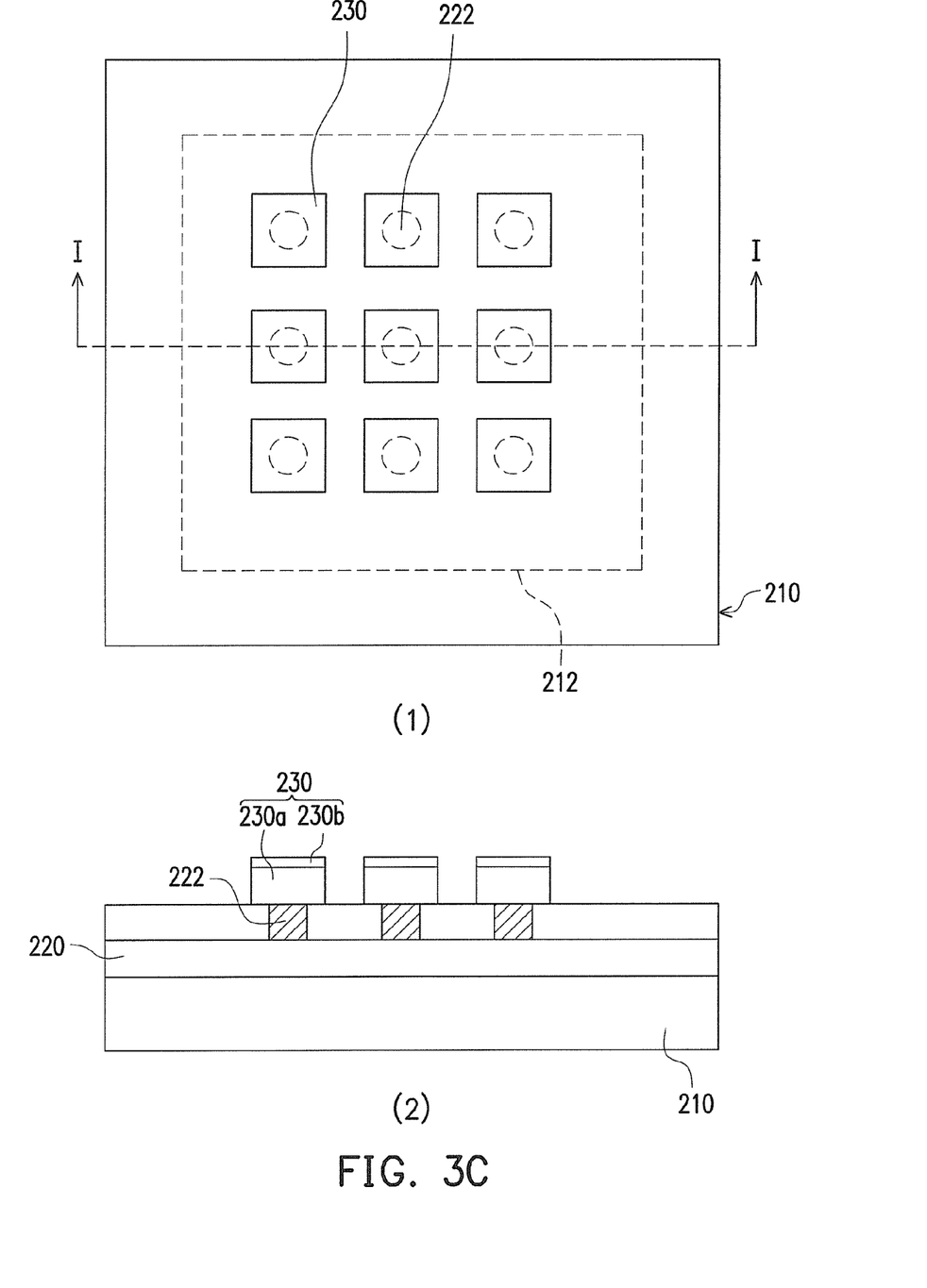

Referring to each of FIGS. 3B and 3C, part (1) is a top view of the device, and part (2) is a cross-sectional view along the line I-I in part (1). Next, a plurality of bottom electrodes 230 is formed in the active region 212, and each of the bottom electrodes 230 is disposed to correspond to each of the conductive channels 222. The step for forming the bottom electrode 230 is, for example, sequentially depositing a first film layer 230a and a second film layer 230b on the substrate 210 shown in FIG. 3B. Then, as shown in FIG. 3C, a photolithography and etching process is performed on the first film layer 230a and the second film layer 230b. Hence, the plurality of bottom electrodes 230 is formed. Referring to FIG. 3C, each of the bottom electrodes 230 includes the first film layer 230a and the second film layer 230b on the first film layer 230a, and a material of the first film layer 230a may be titanium (Ti), and a material of the second film layer may be titanium nitride (TiN). However, the metal stack of the first film layer 230a and the second film layer 230b may be changed with the constant improvement in the electrical characteristic of the resistive memory device; the number of the layers may be increased or decreased. In other words, the structure and material of the metal stack may be adequately adjusted. The above is merely one of the examples, and the present invention is not limited thereto.

Figure 3D:
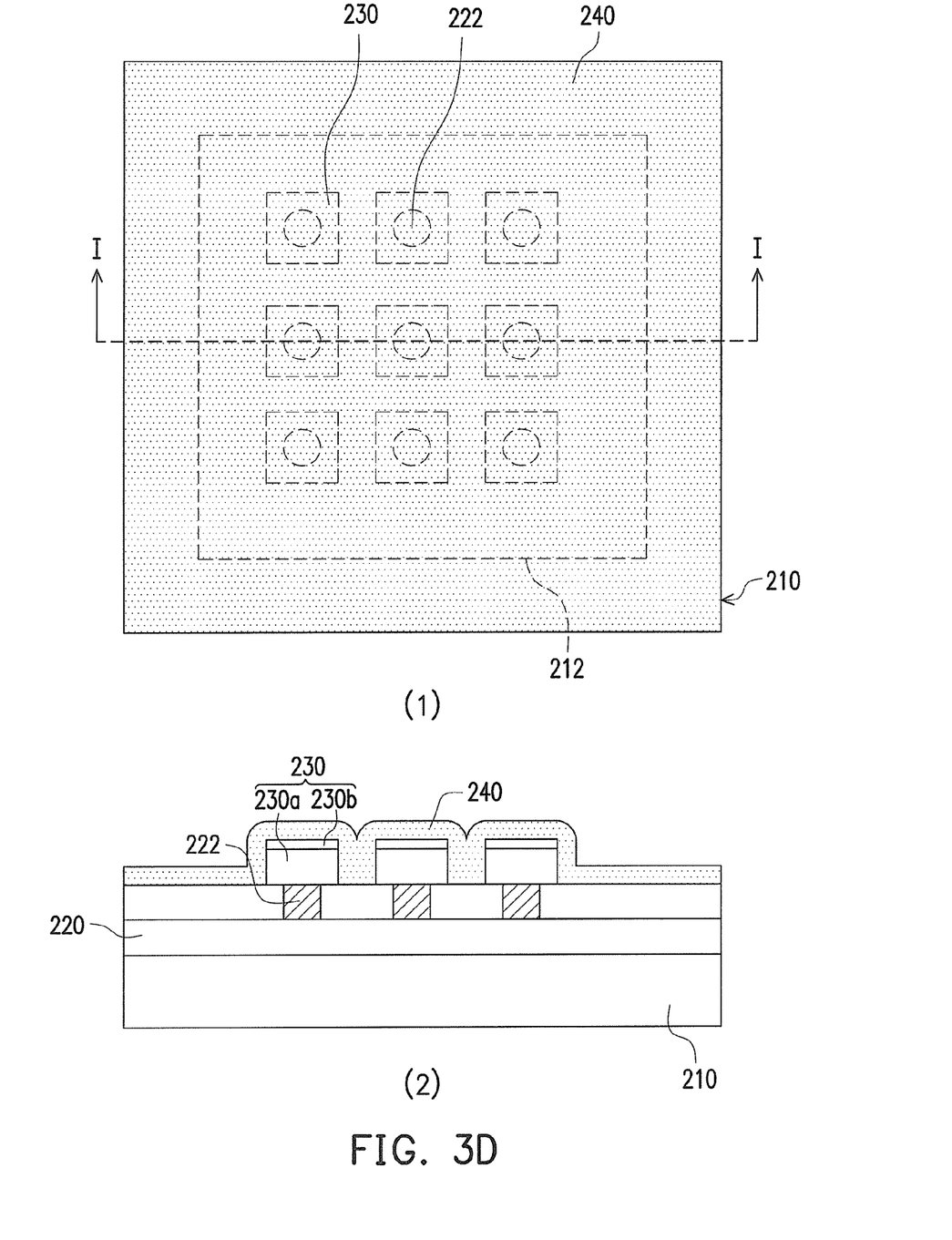
Figure 3E:
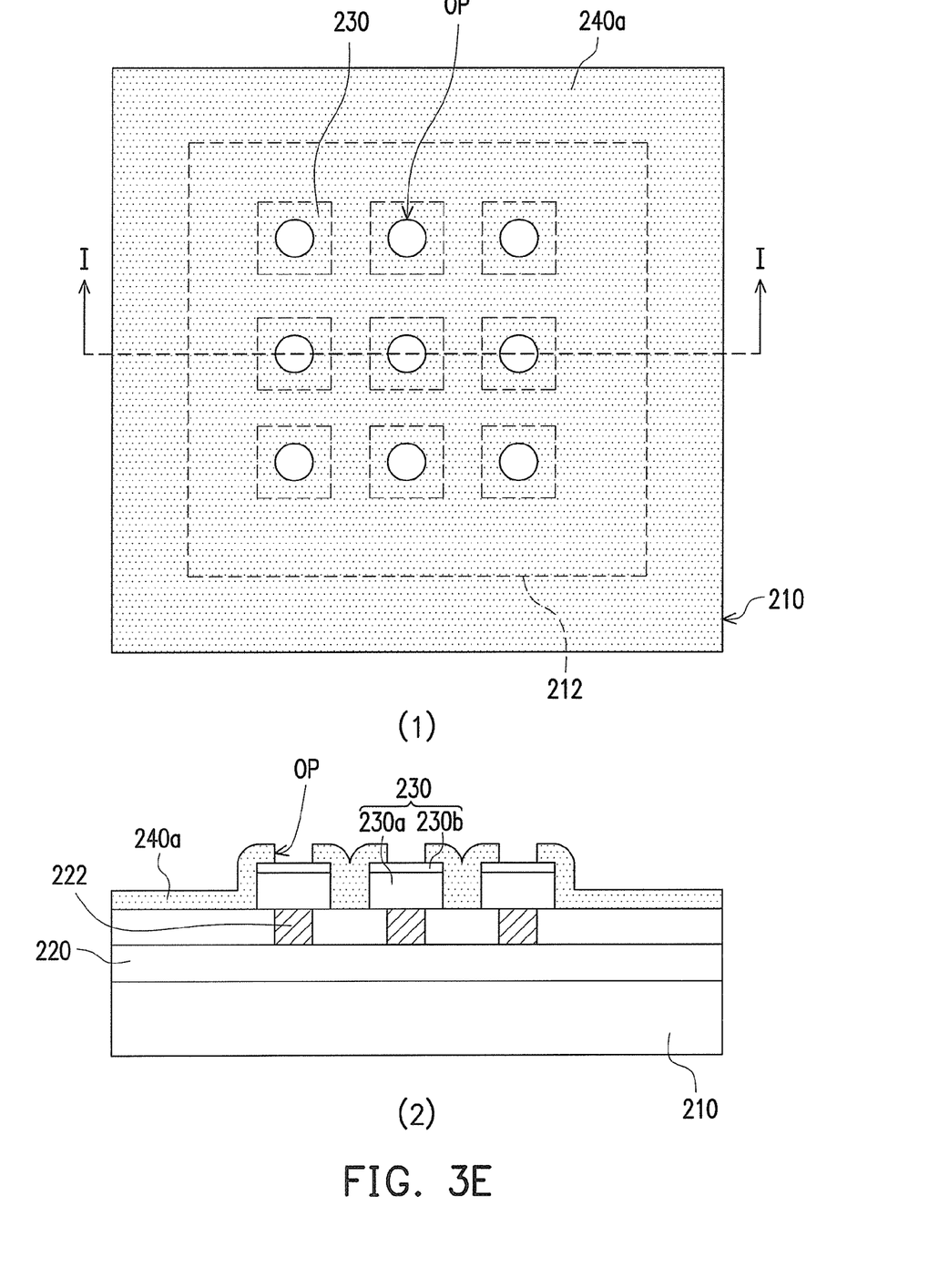

Referring to each of FIGS. 3D and 3E, part (1) is a top view of the device, and part (2) is a cross-sectional view along the line I-I in part (1). Next, a patterned sacrificial layer 240a is formed on the substrate 210 and covers the bottom electrodes 230. The patterned sacrificial layer 240a has a plurality of openings OP. Each of the openings OP is disposed to correspond to each of the bottom electrodes 230 and exposes a part of each of the bottom electrodes 230. The steps for forming the patterned sacrificial layer 240a are, for example, described as follows. A sacrificial layer 240 is formed on the substrate 210 shown in FIG. 3D. Then, as shown in FIG. 3E, a photolithography and etching process is performed on the sacrificial layer 240 to form the openings OP. According to an embodiment, a material of the patterned sacrificial layer 240a includes the germanium-antimony-tellurium alloy or the amorphous carbon thin film. An annealing temperature of the patterned sacrificial layer 240a is from about 100° C. to about 400° C.

Figure 3F:
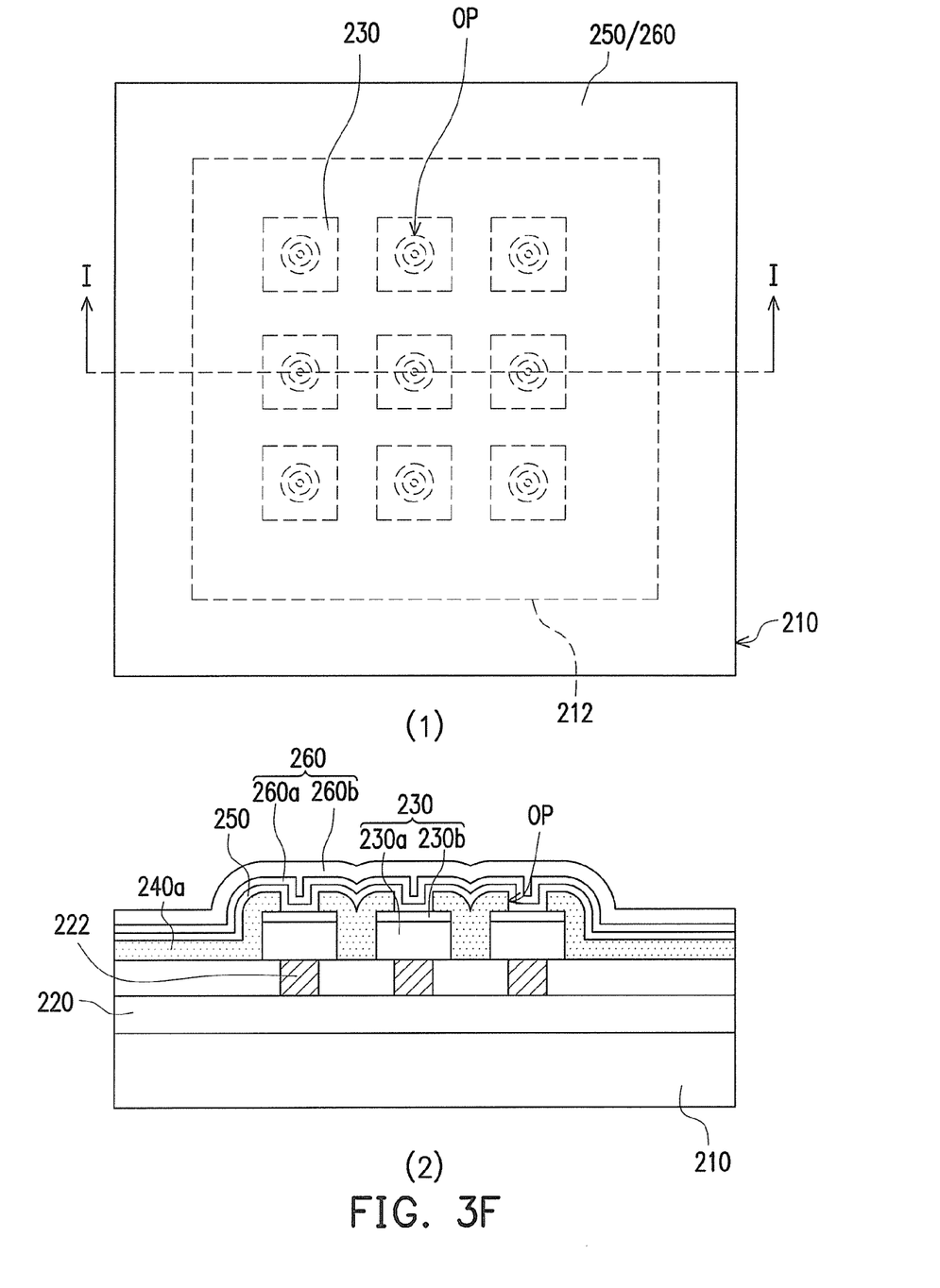

Referring to FIG. 3F, part (1) is a top view of the device, and part (2) is a cross-sectional view along the line I-I in part (1). Then, a resistance switching material layer 250 and a top electrode layer 260 are sequentially formed on the patterned sacrificial layer 240a, wherein the resistance switching material layer 250 and the top electrode layer 260 fill the openings OP. A material of the resistance switching material layer 250 includes: hafnium oxide ($HfO_x$), nickel oxide ($NiO_x$), titanium oxide ($TiO_x$), zirconium oxide ($ZrO_x$), silicon oxide (SiOx, where x is not equal to 2), tungsten oxide ($WO_x$), or copper oxide ($CuO_x$). Each of the top electrodes 260 may include a third film layer 260a and a fourth film layer 260b on the third film layer 260a, and a material of the third film layer 260a may be, for example, titanium (Ti), and a material of the fourth film layer may be, for example, titanium nitride (TiN). However, the metal stack of the third film layer 260a and the fourth film layer 260b may be changed with the constant improvement in the electrical characteristic of the resistive memory device; the number of the layers may be increased or decreased. In other words, the structure and material of the metal stack may be adequately adjusted. The above is merely one of the examples, and the present invention is not limited thereto.

Figure 3G:
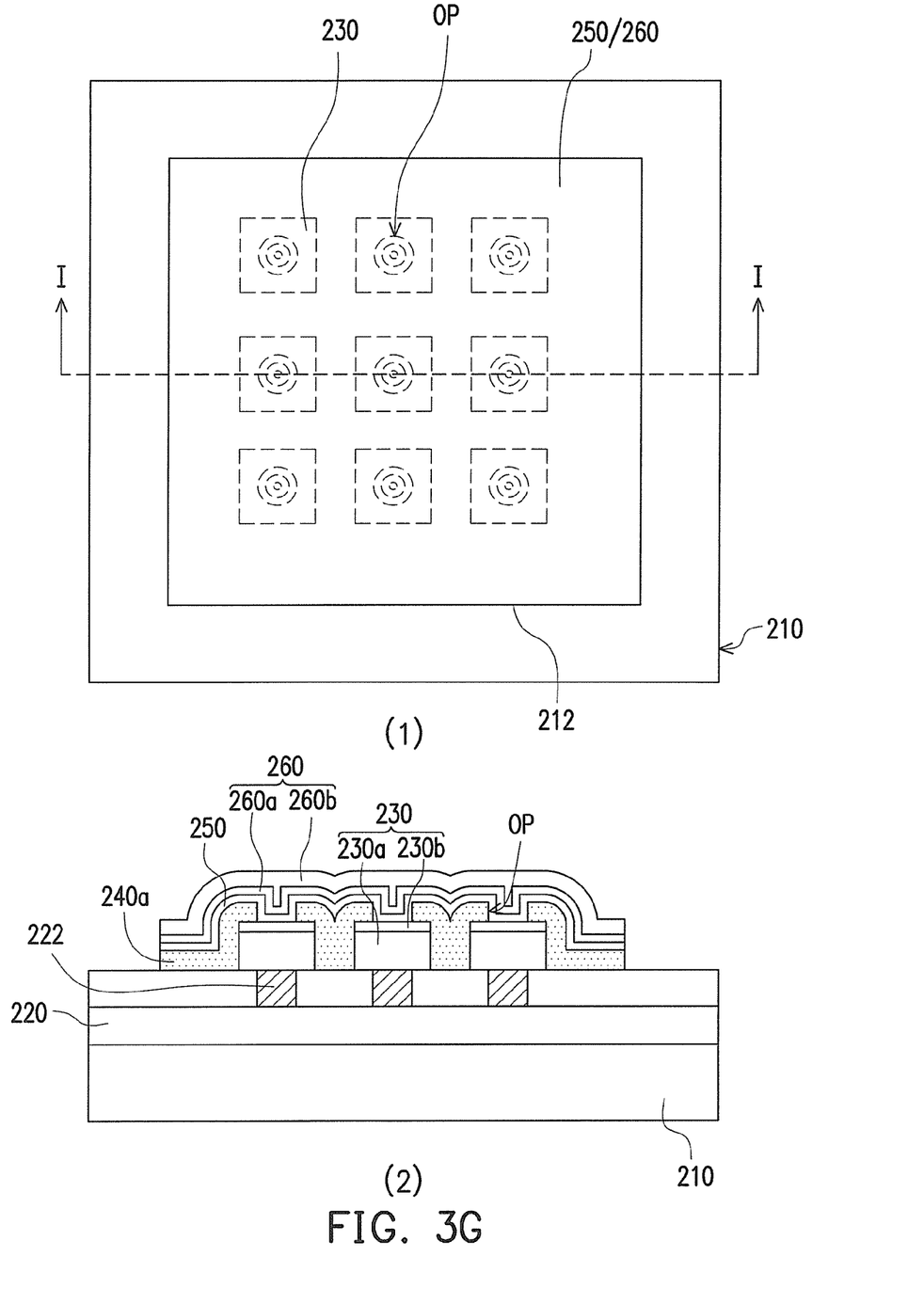

Referring to FIG. 3G, part (1) is a top view of the device, and part (2) is a cross-sectional view along the line I-I in part (1). Next, the top electrode layer 260, the resistance switching material layer 250, and the patterned sacrificial layer 240a outside the active region 212 are removed. The above step may be performed by a general photolithography and etching process.

Figure 3H:
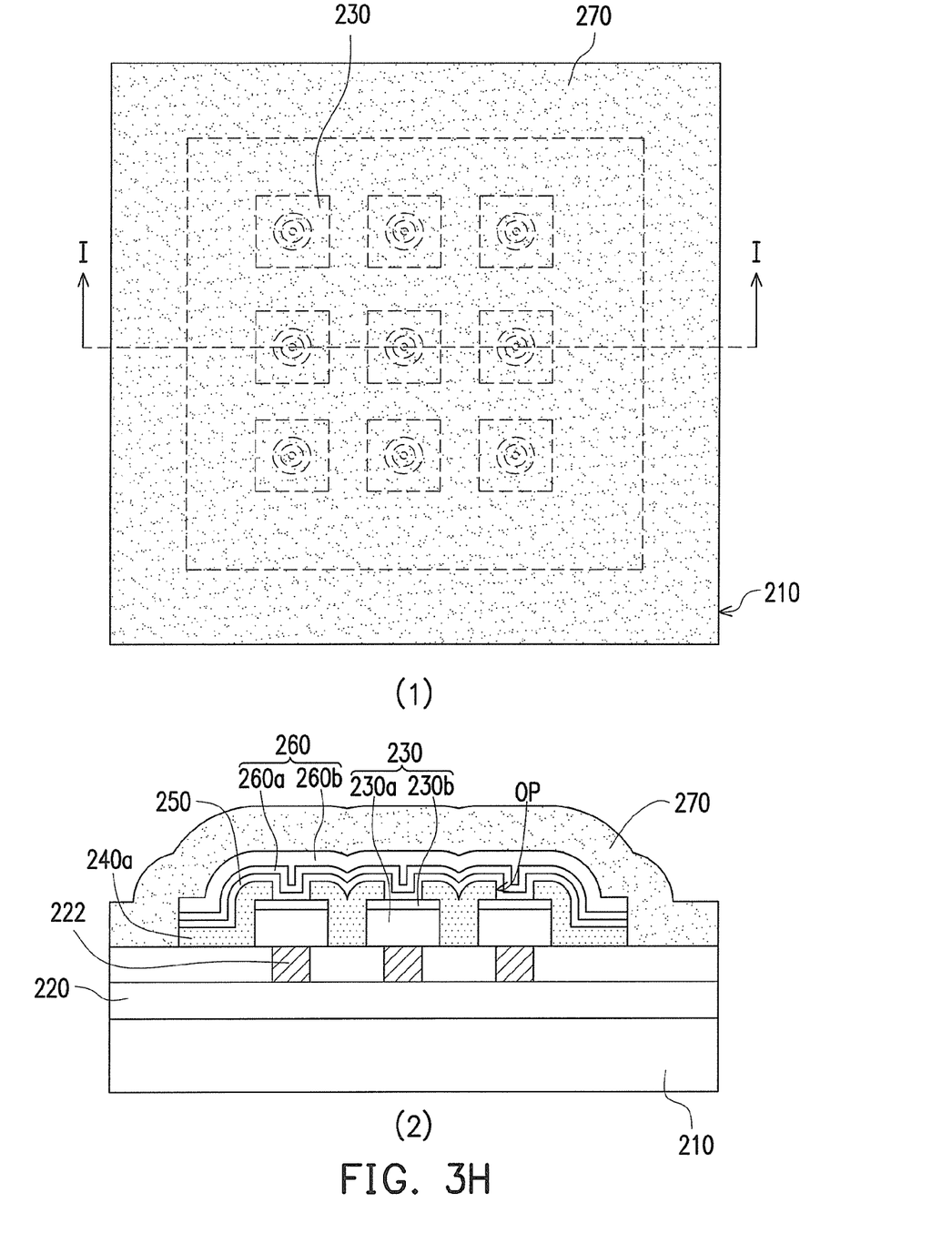

Referring to FIG. 3H, part (1) is a top view of the device, and part (2) is a cross-sectional view along the line I-I in part (1). Then, a conductive layer 270 is formed on the substrate 210. The method of forming the conductive layer 270 may be a physical vapor deposition method or an appropriate thin film deposition process. A material of the conductive layer 270 may be, for example, an aluminum-metal single or multi-layer, such as pure aluminum (Al), an aluminum-copper (Al—Cu) alloy, an aluminum-tantalum nitride (Al—TaN) bi-layer, an aluminum-copper-tantalum nitride (Al—Cu—TaN) bi-layer, an aluminum-copper-titanium nitride (Al—Cu—TiN), bi-layer or a material which may include any metals.

Figure 3I:
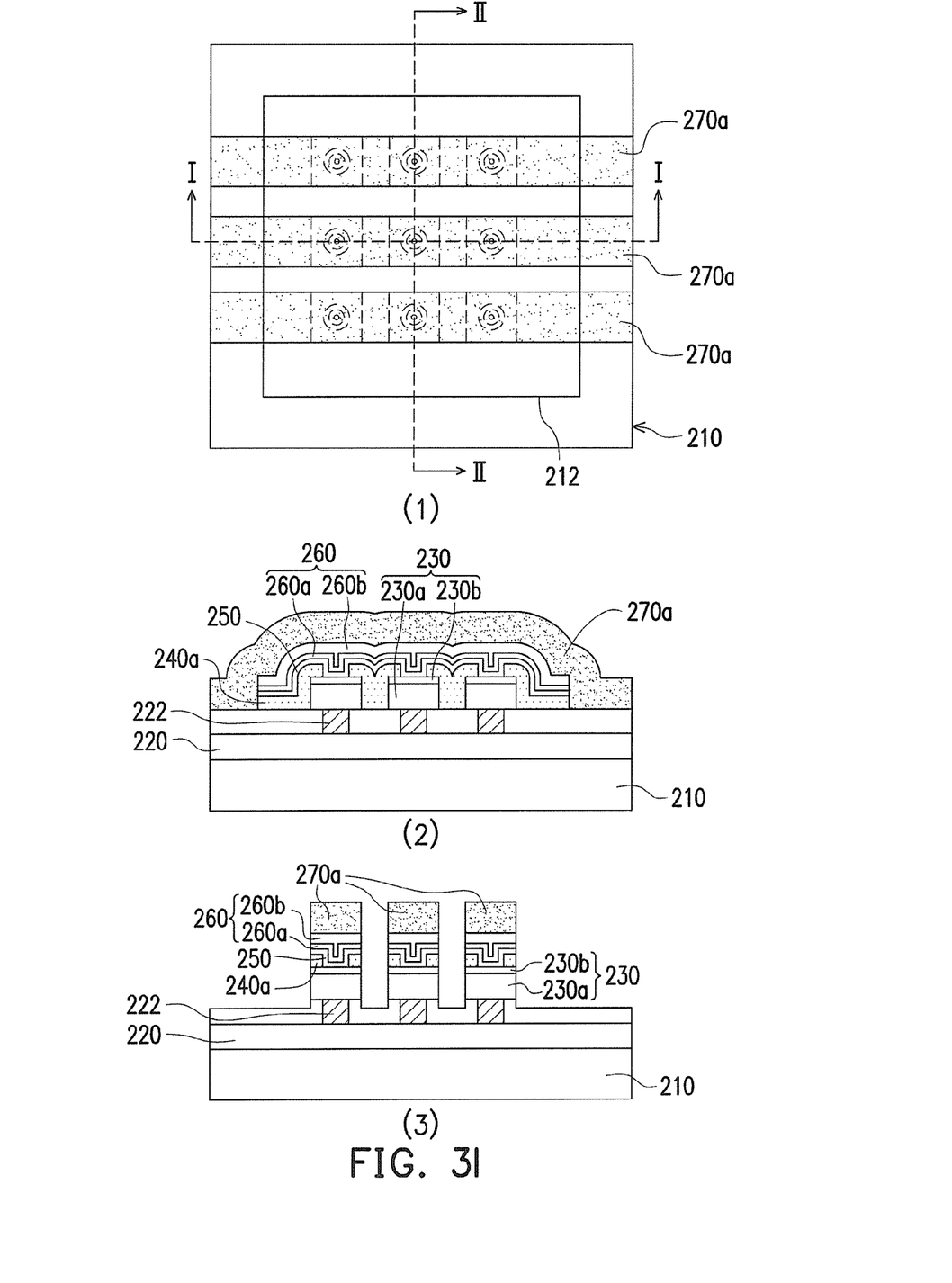

Referring to FIG. 3I, part (1) is a top view of the device, part (2) is a cross-sectional view along the line I-I in part (1), and part (3) is a cross-sectional view along the line II-II in part (1). Next, the conductive layer 270, the top electrode layer 260, and the resistance switching material layer 250 are subsequently patterned, so that a plurality of patterned interconnections 270a is formed by the conductive layer 270, and a part of the patterned sacrificial layer 240a is exposed. In detail, as shown in part (3) of FIG. 3I, during the photolithography and etching process on the conductive layer 270, the multi-layered film stack (the top electrode 260 and the resistance switching material layer 250) are over etched, so that sides of the patterned sacrificial layer 240a are exposed. 100% etched out of patterned sacrificial layer 240a within space between two conductive layers 270 is optional for the sake of avoiding plasma charging.

Figure 3J:
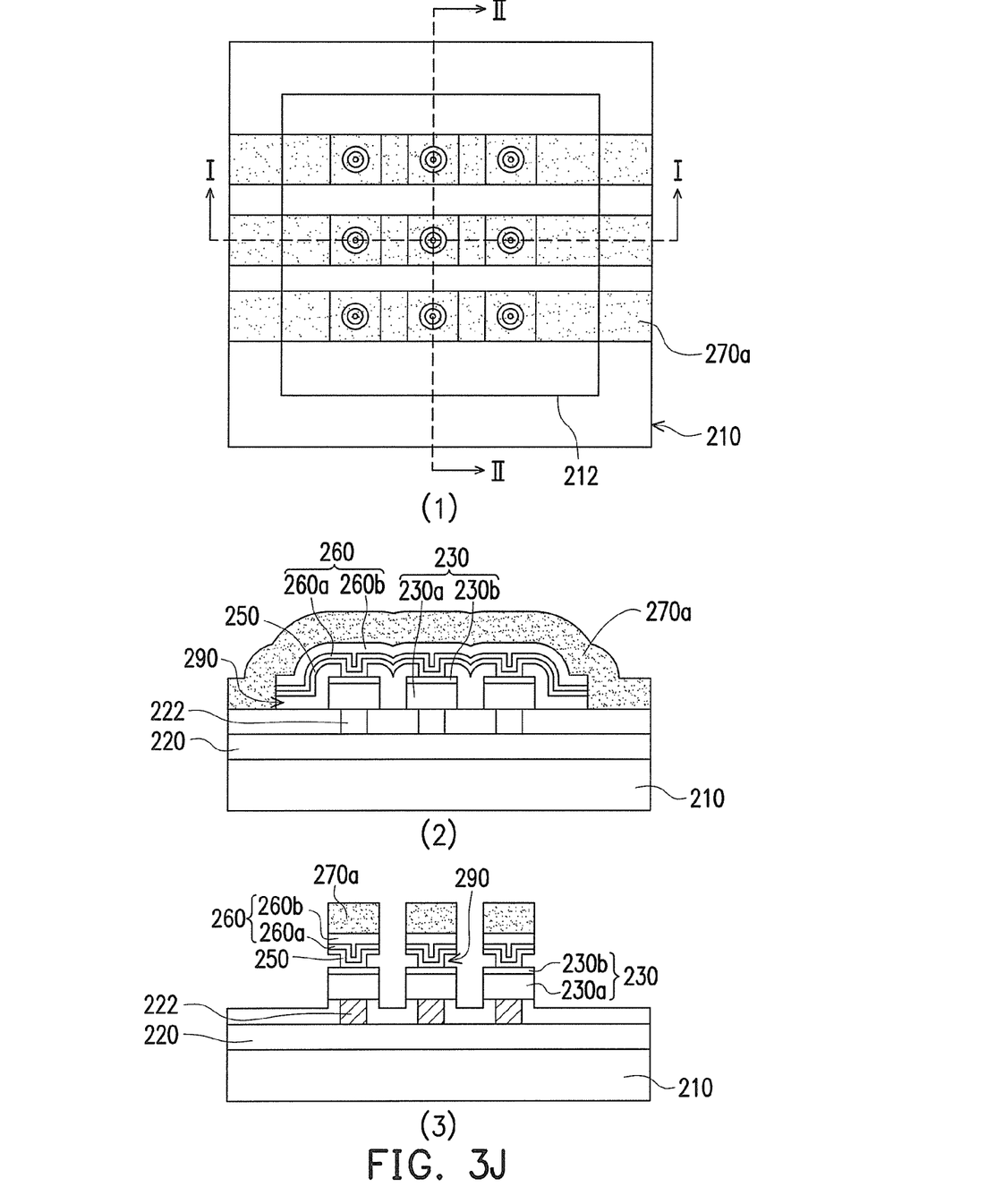

Referring to FIG. 3J, part (1) is a top view of the device, part (2) is a cross-sectional view along the line I-I in part (1), and part (3) is a cross-sectional view along the line II-II in part (1). Afterwards, a reactant 280 is provided to react with the patterned sacrificial layer 240a, and the patterned sacrificial layer 240a is removed to form an air dielectric layer 290 disposed at the original position of the patterned sacrificial layer 240a. For example, when the material of the patterned sacrificial layer 240a is the germanium-antimony-tellurium alloy, the reactant 280 is, for example, the organic acid which substantially includes gallic acid and the solvent. Alternatively, the reactant 280 may be the hydrogen-helium plasma. The weight percentage of hydrogen in the hydrogen-helium plasma is, for example, about 5%, and the weight percentage of helium in the hydrogen-helium plasma is, for example, about 95%. The hydrogen-helium plasma reacts with the sacrificial layer 240a for 400 to 800 seconds. Additionally, when the material of the patterned sacrificial layer 240a is the amorphous carbon thin film, the reactant 280 may be the oxygen plasma. By performing the above steps, the resistive memory device 200 is fabricated.

Still referring to FIG. 3J, similar to that illustrated in FIG. 1D, after the step of removing the patterned sacrificial layer 240a, the resistance switching material layer 250 may be further washed with the deionized water 150. In addition, similar to that described in FIG. 1E, after the step of washing the resistance switching material layer 250 with the deionized water 150, IPA is further used to perform dry cleaning on the resistance switching material layer 250, so that the water which causes pattern collapse is completely brought away by the IPA.

Next, please refer to FIG. 3I. Since the patterned sacrificial layer 240a adopts the germanium-antimony-tellurium alloy or the amorphous carbon thin film which is conductive, the patterned sacrificial layer 240a has effects of parallelly connected electrodes. In detail, when the plasma (not shown) is used to etch the conductive layer 270, the top electrode 260, and the resistance switching material layer 250, most of the charges in the plasma are conducted onto the patterned sacrificial layer 240a but not to an interface between the resistance switching material layer 250 and the bottom electrodes 230. Hence, damage to the electrical characteristics of the interface (the operating region of the resistive memory device 200) between the resistance switching material layer 250 and the bottom electrodes 230 is avoided, so that the resistive memory device 200 maintains good operating characteristics.

Afterwards, the reactant 280a is highly selective towards the patterned sacrificial layer 240, so that the patterned sacrificial layer 240a is well removed, thereby forming the air dielectric layer 290 in the resistive memory device 200. In particular, the reactant 280 does not include halogens, so that the reactant 280 does not affect the film layers and the electrical characteristics of the resistive memory device 200. When the reactant 280 is the organic acid (which includes gallic acid and the solvent) and is used for wet washing, the damage to the resistive memory device 200 caused by the charges in the plasma is further prevented.

The annealing temperature of the patterned sacrificial layer 240a may be from about 100° C. to 400° C., so that the patterned sacrificial layer 240a is only removed at the last step of the process. In other words, the patterned sacrificial layer 240a is capable of sustaining the high temperature during formation of the conductive layer 270 in FIG. 3H and is not damaged by the high temperature environment.

The air dielectric layer 290 of the resistive memory device is able to prevent leakage current effects to eliminate noise, and is able to reduce parasitic capacitance so that the resistive memory device 200 is capable of operating at high frequencies.

As shown in FIG. 3J, the resistive memory device 200 which has the conductive channels 222 may have a same memory density as a pillar resistive memory device. Thus, the density of resistive memory units is greatly increased.

Resistive Memory Device

FIG. 3J is a schematic view of a resistive memory device fabricated by a method using a process of an air gap fabricating method according to one of the exemplary embodiments of the invention. In FIG. 3J, part (1) is a top view of the device, part (2) is a cross-sectional view along the line I-I in part (1), and part (3) is a cross-sectional view along the line II-II in part (1). The resistive memory device 200 includes the substrate 210, the plurality of bottom electrodes 230, and the following which are sequentially stacked: the patterned resistance switching material layer 250, the patterned top electrode layer 260, and the plurality of patterned interconnections 270a. The substrate 210 has the active region 212, and the front end circuit 220 is formed in the active region 212. The front end circuit 220 has the plurality of conductive channels 222 arranged as an array. The bottom electrodes 230 are formed in the active region 212, and each of the bottom electrodes 230 is disposed to correspond to each of the conductive channels 222. The patterned resistance switching material layer 250 and the patterned top electrode layer 260 are sequentially stacked on the bottom electrodes 230. In particular, the air dielectric layer 290 exists between the patterned resistance switching material layer 250 and the bottom electrodes 230. The patterned interconnections 270a are disposed on the patterned top electrode 260.

The composition, material, and the like of each element of the resistive memory device 200 are described in the resistive memory fabrication method shown in FIGS. 3A to 3J and are not repeatedly described.

In summary, the air gap fabricating method, the resistive memory device, and the fabricating method thereof according to the embodiments have at least the following advantages.

In the air gap fabricating method, the patterned sacrificial layer which has a main constituent of the germanium-antimony-tellurium alloy is used in cooperation with the reactant (which is mainly gallic acid or the hydrogen-helium plasma) which is highly reactive towards the patterned sacrificial layer, so that the patterned sacrificial layer is almost completely removed and the air gap is fabricated. By using the resistive memory device and the fabricating method thereof which applies the air gap fabricating method, the resistive memory device with the air gap is fabricated. During the process of fabricating the resistive memory device, the patterned sacrificial layer having a main constituent of the germanium-antimony-tellurium alloy further has the effects of protecting the resistance switching material layer.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An air gap fabricating method, comprising:
   forming a patterned sacrificial layer over a substrate, a material of the patterned sacrificial layer comprising a germanium-antimony-tellurium alloy;
   forming a dielectric layer on the patterned sacrificial layer; and
   providing a reactant to react with the patterned sacrificial layer and remove the patterned sacrificial layer, so as to form a structure with an air gap disposed at an original position of the patterned sacrificial layer, wherein the reactant comprises: an organic acid which substantially comprises gallic acid and a solvent.

2. The air gap fabricating method of claim 1, after the step of removing the patterned sacrificial layer, further comprising a step of
   washing the dielectric layer with a deionized water.

3. The air gap fabricating method of claim 2, after the step of washing the dielectric layer with the deionized water, further comprising a step of dry cleaning the dielectric layer with Isopropyl Alcohol (IPA).

4. The air gap fabricating method of claim 1, wherein a material of the dielectric layer comprises silicon oxide or silicon nitride.

5. The air gap fabricating method of claim 1, further comprising a step of covering a multi-layered stack of a semiconductor layer and a metal layer on the dielectric layer.

6. The air gap fabricating method of claim 5, wherein a material of the semiconductor layer comprises polysilicon or amorphous silicon.

7. The air gap fabricating method of claim 5, wherein a material of the metal layer comprises aluminum, copper, tungsten, nickel, cobalt, titanium, a tungsten-titanium alloy, titanium nitride, tantalum nitride, titanium silicide, tantalum silicide, nickel silicide, or cobalt silicide, alone of combination thereof.

8. The air gap fabricating method of claim 1, wherein a metal pattern is formed on the substrate, and a metal oxide layer is formed on the metal pattern, when the reactant is used to remove the patterned sacrificial layer, the reactant simultaneously removes the metal oxide layer.

9. The air gap fabricating method of claim 1, wherein an annealing temperature of the patterned sacrificial layer is from about 100° C. to about 400° C.

10. A semiconductor structure using an air gap as a dielectric layer therein, the air gap is fabricated by a method as claimed in claim 1.

11. The semiconductor structure of claim 10 is used in a resistive memory device.

12. The semiconductor structure of claim 10 is used in a micro electro-mechanical system (MEMS), a nano electro-mechanical system (NEMS), a semiconductor device with copper wires, a radio frequency device or a dynamic random access memory.

13. An air gap fabricating method, comprising:
   forming a patterned sacrificial layer over a substrate, a material of the patterned sacrificial layer comprising a germanium-antimony-tellurium alloy;
   forming a dielectric layer on the patterned sacrificial layer; and
   providing a reactant to react with the patterned sacrificial layer and remove the patterned sacrificial layer, so as to form a structure with an air gap disposed at an original position of the patterned sacrificial layer, wherein the reactant comprises a hydrogen-helium plasma.

14. The air gap fabricating method of claim 13, wherein a weight percentage of hydrogen in the hydrogen-helium plasma is substantially about 5%, and a weight percentage of helium in the hydrogen-helium plasma is substantially about 95%.

15. The air gap fabricating method of claim 13, wherein the hydrogen-helium plasma reacts with the patterned sacrificial layer for about 400 to about 800 seconds.

16. The air gap fabricating method of claim 13, after the step of removing the patterned sacrificial layer, further comprising a step of
   washing the dielectric layer with a deionized water.

17. The air gap fabricating method of claim 16, after the step of washing the dielectric layer with the deionized water, further comprising a step of dry cleaning the dielectric layer with Isopropyl Alcohol (IPA).

18. The air gap fabricating method of claim 13, wherein a material of the dielectric layer comprises silicon oxide or silicon nitride.

19. The air gap fabricating method of claim 13, further comprising a step of covering a multi-layered stack of a semiconductor layer and a metal layer on the dielectric layer.

20. The air gap fabricating method of claim 19, wherein a material of the semiconductor layer comprises polysilicon or amorphous silicon.

21. The air gap fabricating method of claim 19, wherein a material of the metal layer comprises aluminum, copper, tungsten, nickel, cobalt, titanium, a tungsten-titanium alloy, titanium nitride, tantalum nitride, titanium silicide, tantalum silicide, nickel silicide, or cobalt silicide, alone of combination thereof.

22. The air gap fabricating method of claim 13, wherein a metal pattern is formed on the substrate, and a metal oxide layer is formed on the metal pattern, when the reactant is used to remove the patterned sacrificial layer, the reactant simultaneously removes the metal oxide layer.

23. The air gap fabricating method of claim 13, wherein an annealing temperature of the patterned sacrificial layer is from about 100° C. to about 400° C.

24. A semiconductor structure using an air gap as a dielectric layer therein, the air gap is fabricated by a method as claimed in claim 13.

25. The semiconductor structure of claim 24 is used in a resistive memory device.

26. The semiconductor structure of claim 24 is used in a micro electro-mechanical system (MEMS), a nano electro-mechanical system (NEMS), a semiconductor device with copper wires, a radio frequency device or a dynamic random access memory.

* * * * *